United States Patent [19]
Chadha et al.

[11] Patent Number: 6,091,349
[45] Date of Patent: Jul. 18, 2000

[54] NOISE MANAGEMENT SCHEME FOR HIGH-SPEED MIXED-SIGNAL INTEGRATED CIRCUITS

[75] Inventors: Mandeep Singh Chadha; Prabir C. Maulik, both of Austin, Tex.

[73] Assignee: Cirrus Logic, Inc., Fremont, Calif.

[21] Appl. No.: 09/163,767

[22] Filed: Sep. 30, 1998

[51] Int. Cl.[7] .................................................. H03M 1/06
[52] U.S. Cl. ........................ 341/118; 341/144; 341/155
[58] Field of Search ................................. 341/118, 144, 341/155

[56] References Cited

U.S. PATENT DOCUMENTS

| | | |
|---|---|---|
| 4,194,183 | 3/1980 | Neuner et al. ........................... 341/144 |
| 4,202,042 | 5/1980 | Connors et al. ........................ 341/155 |
| 4,746,899 | 5/1988 | Swanson et al. . | 
| 4,772,871 | 9/1988 | Suzuki et al. . |
| 5,307,066 | 4/1994 | Kobayashi et al. ..................... 341/155 |
| 5,369,309 | 11/1994 | Bacrania et al. . |
| 5,373,293 | 12/1994 | Hirata . |
| 5,805,094 | 9/1998 | Roach et al. ............................ 341/144 |

OTHER PUBLICATIONS

D.R. Welland, B.P. Del Signore, and E.J. Swanson, A Stereo 16–Bit Delta —Sigma A/D Converter for Digital Audio, Journal of the Audio Engineering Society, Jun. 1989, pp. 476–486, vol. 37.

*Primary Examiner*—Howard L. Williams
*Assistant Examiner*—Jean B. Jeanglaude
*Attorney, Agent, or Firm*—Peter Rutkowski; J. P. Violette; William W. Kidd

[57] ABSTRACT

A technique for separating an operation of a digital stage into separate noise generation periods in order to time the generation of noise from the digital stage. The invention is utilized in a mixed-signal integrated circuit having analog and digital signals in which the timing of the noise generation ensures that noise is abated during an analog sampling event.

26 Claims, 4 Drawing Sheets

NOISE MANAGEMENT SCHEME FOR HIGH-SPEED MIXED-SIGNAL INTEGRATED CIRCUITS

BACKGROUND OF THE INVENTION

1. Field of the Invention

The present invention relates to the field of mixed signal integrated circuits and, more particularly, to noise management in an analog-to-digital converter.

2. Background of the Related Art

The use of analog-to-digital converters (A/D converters or ADCs) to convert analog signals into digital signals is well known in the art. State-of-the-art practice is to fabricate an ADC on a single integrated circuit chip. Generally, an ADC samples an analog signal at a sampling rate which is twice the highest frequency component being sampled. This is known as the Nyquist rate. The sampled signal is processed and converted into a digital format for output from the converter.

Another type of ADC employs an oversampling technique in which the analog input signal is sampled at a much higher rate than the Nyquist rate. The higher sampling rate improves the performance of the ADC for signal conversion and processing. One commonly used oversampling type of ADC uses a delta-sigma ($\Delta\Sigma$) modulator for oversampling the analog input. The oversampled output of the $\Delta\Sigma$ modulator is coupled to a decimator, which employs a low-pass filtering technique to extract the lower frequency components to generate a converted digital output signal at the Nyquist rate.

It is appreciated that ADCs are mixed-signal devices in that both analog and digital signals are present in the ADC. In a mixed-signal design, where both the analog and digital circuitry reside on a monolithic integrated circuit, one main area of design concern is noise management. In mixed-signal devices, it is desirable to minimize digital circuit activity during the time the analog circuitry is sampling the analog input signal. Otherwise, noise generated by the switching of the digital circuitry will couple into the analog circuitry, for example through the substrate. In order to prevent the digital noise at the analog sampling times or events, techniques have been designed to circumvent the noise coupling.

In one technique, the digital clock is delayed with respect to the analog clock so that the digital circuitry is triggered by the digital clock, only after the analog sampling has occurred. This technique allows analog sampling to occur just prior to the commencement of the operation of the digital circuitry and in which the digital circuitry is permitted to complete its operation prior to the next analog sampling event. Another technique simply drops (removes) the digital clocking during the analog sampling event.

The above techniques are capable of achieving the desired result of managing noise presence during the analog sampling event, as long as the digital clocking frequency is noticeably higher than the analog clocking frequency. In earlier mixed-signal devices, this was typically the case. However, current generation ADCs employ analog clocking frequencies which are at or proximal to the digital clocking frequency. Hence, delaying or dropping the digital clock cycle is not an efficient solution.

One solution to address this problem is to implement a much faster digital circuitry. The present invention provides for a solution to manage noise generation during the analog sampling, without the need to implement a much faster digital circuitry.

SUMMARY OF THE INVENTION

The present invention describes a technique for separating an operation of a digital stage into separate activation periods, in order to time the generation of noise from the digital stage. The invention is utilized in a mixed-signal integrated circuit having analog and digital signals in which noise generation is reduced during the occurrence of an analog sampling event.

Generally, a first digital circuit forms a front end of the digital stage, while a second digital circuit is coupled subsequent to the first digital circuit. The digital stage commences to process a digital signal input to the stage at the start of the clock cycle. A timing circuit prevents the activation of the second digital circuit until a later period of the clock cycle, but not until after an occurrence of the analog sampling event.

DETAILED DESCRIPTION OF THE INVENTION

Figure 1:
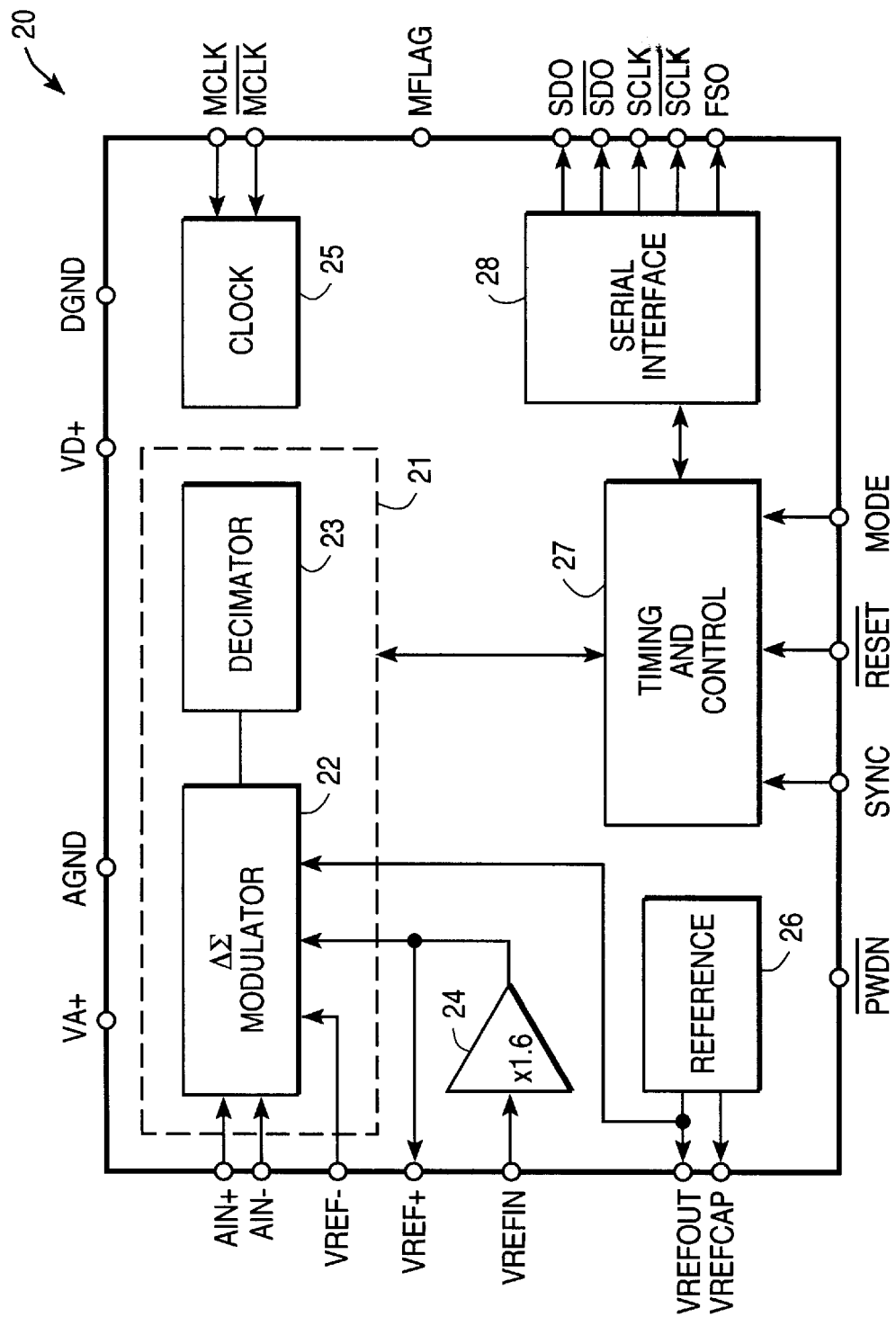
FIG. 1 is a system level block diagram of an oversampling type analog-to-digital converter using a delta-sigma modulator and in which the present invention is utilized to abate digital noise during sampling of the analog input signal.

Referring to FIG. 1, an analog-to-digital converter (A/D converter or ADC) 20 which implements the present invention is shown. ADC 20 is fabricated on a single integrated circuit chip and in the particular embodiment is a monolithic complementary metal-oxide-semiconductor (CMOS) device designed to operate in continuous mode after being reset. However, it is understood that the ADC can be fabricated as a multiple-chip device or using other semiconductor process technology. Furthermore, although the invention is described in reference to an ADC, it can be practiced in other circuitry as well for the purpose of managing noise in other mixed-signal devices.

The ADC 20 utilizes a delta-sigma ($\Delta\Sigma$) modulator 22 at the front end of the conversion section 21, while a decimator 23 provides the decimation and filter function at the back end. An analog signal to the ADC 20 is input into the AIN+ and AIN− pins as a fully differential signal with peak-to-peak amplitude of VREFIN×1.6V. Reference voltage VREFIN is multiplied by 1.6 by buffer 24 to provide this reference. The input signal common mode voltage is in a range of 1 to VREFIN volts.

The clocking for the ADC is provided by a clock circuit 25. The ADC 20 is driven from a CMOS-compatible clock at its MCLK pin. The required MCLK is 64×OWR (output word rate). The ADC 20 can be operated with MCLK frequencies from 512 KHz up to 26 MHz. The output word rate scales with the MCLK rate with OWR=MCLK/64. A second clock input pin, MCLK# (# is used herein to designate a complement or a low activation state of a signal) allows the user to run a fully differential clock to the ADC 20 to minimize radiated noise from the printed circuit board layout.

The ADC 20 can be configured to operate from either its internal voltage reference 26 or from an external voltage reference. The on-chip voltage reference is 2.375 volts and is referenced to the analog ground, AGND, pin. The 2.375 volt reference is output from the VREFOUT pin, filtered and returned to the VREFIN pin. The buffer 24 has a gain of 1.6 to generate the reference signal to the ΔΣ modulator 22. Alternatively, the ADC 20 can be configured to use an external voltage reference.

A timing and control circuit 27 provides the necessary controls for the ADC 20 and to output the conversion words from a serial interface 28. The output from the interface 28 is a synchronous self-clocking format, which includes SDO (serial data output) and its complement SDO#, serial clock SCLK and its complement SCLK#, and FSO (frame synchronization output). FSO falls at the beginning of an output word. Data is output in two's complement format, most significant bit first. FSO stays low for 16 SCLK cycles and the SCLK output is at a rate equal to MCLK/3.

Additionally, RESET# pin is provided for resetting the ADC 20, such as at power up. A PWDN# pin allows for activation of a reduced power consumption mode. A MFLAG pin is provided for a flag signal which indicates when the ADC 20 has become unstable. A MODE pin allows for operation of the ADC 20 in normal mode of operation or in modulator only mode. In normal mode, ADC 20 utilizes the digital decimator 23 and the calibration circuitry. In the modulator only mode, the decimation filter and the calibration circuitry in the ADC 20 are turned off and the ADC 20 outputs the 1-bit value from the modulator output. A SYNC input is provided for to restart the digital filter at the beginning of its convolution cycle, in which the filters of multiple converters in the system are synchronized.

It is appreciated that the operation of ADC 20 and its components are described for understanding the mixed-signal environment in which the present invention is implemented. However, the operation of ADC 20 is not critical to understanding the practice of the present invention. The present invention can be implemented in a variety of ADCs, and not necessarily converters using ΔΣ modulators. Furthermore, the present invention can be readily adapted to other mixed signal circuitry, other than ADCs.

Figure 2:
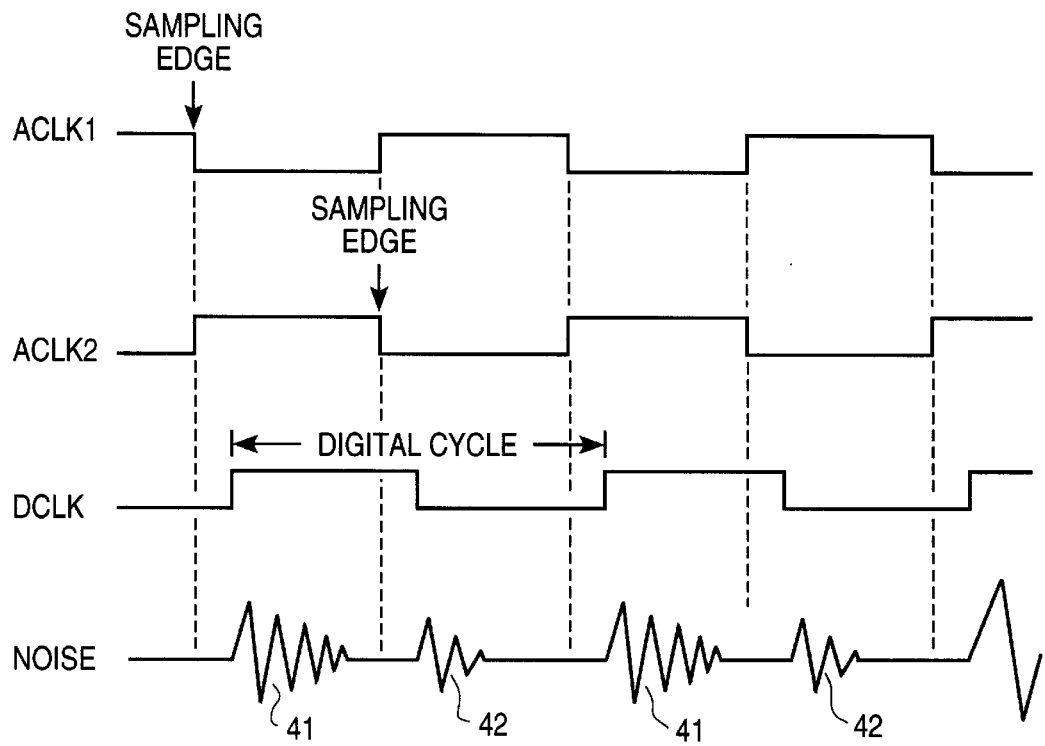
FIG. 2 is a waveform diagram showing the generation of noise from the digital circuitry clocked by the digital clocking signal when noise generation from the digital circuitry is separated into separate components in order to abate noise generation during sampling of the analog input signal.

Referring to FIG. 2, the technique of the present invention for managing noise generated by a digital circuitry is illustrated. In FIG. 2, several waveform diagrams are shown to illustrate the noise management technique of the invention, particularly when the analog clocking frequency is at or proximal to the digital clocking frequency for mixed-signal devices. Analog clocks ACLK1 and ACLK2 are shown. Although the periods could vary, in the example shown, ACLK2 is the complement of ACLK1. The sampling occurs at the trailing edge of the analog clocking signals, which effectively means that analog sampling occurs at both the leading and trailing edges of ACLK1 (or every half-period). The ACLK1 and ACLK2 clocking signals are used to clock switched-capacitor circuits associated with integrators of a ΔΣ modulator, such as the ΔΣ modulator 22 of FIG. 1.

A digital clocking signal DCLK is shown in which a digital cycle occurs over the full period from rising edge to rising edge. Typically, DCLK is slightly delayed from the ACLK1 sampling edge, so that the first sampling event shown for ACLK1 occurs just prior to the rising edge of DCLK1. This is to ensure that the first analog sampling event occurs prior to the commencement of the digital clocking cycle. Although not shown, it is appreciated that in most systems the digital clock is comprised of master and slave clocks (for example, designated as DCLK1 and DCLK2). However, understanding of a clocking cycle of one digital clocking signal is only needed to understand the noise management problem associated with mixed-signal circuitry.

In FIG. 2, noise generated by the operation of the digital circuitry is shown as NOISE. The noise is most pronounced at the commencement of the digital cycle. When DCLK goes high, it triggers various digital switches (such as flip-flops) to transfer signal states to corresponding digital processing circuitry to perform the digital processing operations of the ADC 20. As the digital circuitry settles to an output state, the noise abates. The implementation of existing noise abatement techniques are adequate as long as the frequency of the analog sampling clock is much less than the frequency of the digital clocking signal.

However, when the analog and digital circuitry are operating at or near the same clocking frequency and the analog sampling event is occurring more than once during the digital cycle (for example, at both the rising and falling edges of the analog clocking signal, as shown), the second analog sampling event may occur before the digital noise abates completely. Accordingly, the analog sampling event at the falling edge of ACLK1 does not present a problem, but the sampling event at the falling edge of ACLK2 could occur during the period when the digital circuitry is still noisy. This is due to some of the digital circuitry still being active when the second sampling event occurs at the falling edge of ACLK2 (which is the rising edge of ACLK1).

Figure 3:
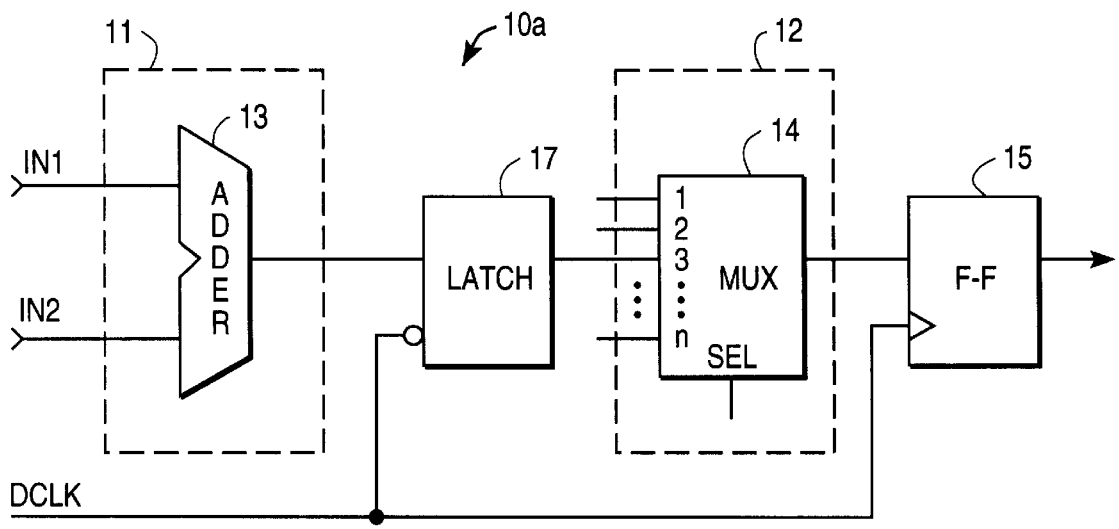
FIG. 3 is a circuit diagram showing a particular digital stage, having an adder and a multiplexer, but in which a latch is inserted between the serially arranged combinational logic circuits to control the timing of noise generation by the digital stage.

An example critical path for a circuit utilized in an ADC is shown in FIG. 3 to illustrate the generation of digital switching noise. A circuit stage 10a is shown comprised of two circuits 11 and 12. Typically, circuits 11 and 12 are comprised of combinational logic and in the specific example, circuit 11 is an adder 13 and circuit 12 is a multiplexer (MUX) 14. The adder 13 receives inputs (shown as inputs IN1 and IN2) from a previous stage, adds the two inputs and generates an adder output for processing by the MUX 14. The MUX 14 selects between the signal coupled from the adder 13 or some other input based on the state of its select (SEL) input. The output of the MUX 14 is coupled to an edge-triggered flip-flop (FF) 15. The FF 15 is clocked by DCLK so that the rising edge of DCLK triggers FF 15 to transfer the MUX 14 output as an output from FF 15.

Thus, when compared to the waveform diagram of FIG. 2, it can be noted that the rising edge of DCLK transfers IN1 and IN2 to the adder 13 (typically, a flip-flop is used at the end of the previous stage to effect the transfer). The digital circuitry commences to operate, which is noted by the high amplitude of the NOISE signal at the commencement of the digital cycle. As the signals transition through the stage 10, the noise begins to abate. It is necessary for the digital processing to be completed prior to the beginning of the next digital cycle, so that at the commencement of the next digital cycle, the processed information from the stage 10a is presented at the output of FF 15. It is also desirable for the digital processing to be completed prior to the commencement of the next analog sampling event.

However, when the next sampling event occurs during the current digital cycle, the digital circuitry for the stage may not have completed its operation prior to this second analog sampling event. That is, some part of the digital circuitry may still be operational, when ACLK2 goes low. The presence of noise from the digital activity will couple into the analog circuitry and will result in the overall noise performance of the ADC 20 to degrade substantially.

The technique of the present invention solves the noise management problem by separating the continues noise generation of the digital circuitry (such as the example stage 10a) into two separate noise components 41 and 42, as exemplified in the NOISE waveform of FIG. 2. The noise separation of the circuit stage 10a is such, that the noise abatement period between the noise components 41 and 42 coincides with the second analog sampling event at the falling edge of ACLK2. Thus, digital noise level is much reduced at the time of the second sampling event.

The present invention performs the noise separation by separating the digital cycle into two noise activation periods, which are half-cycles in the particular example. Noise component 41 occurs with the commencement of the rising edge of DCLK. Noise component 42 is made to occur with the commencement of the falling edge of DCLK. Thus, the edge transitions of the DCLK signal triggers the commencement of each noise component. In circuit terms, a circuit stage, requiring more than half a digital cycle to complete the processing operation, will operate a portion of the stage during one half-cycle and the remaining portion of the stage during the second half-cycle.

Figure 4:
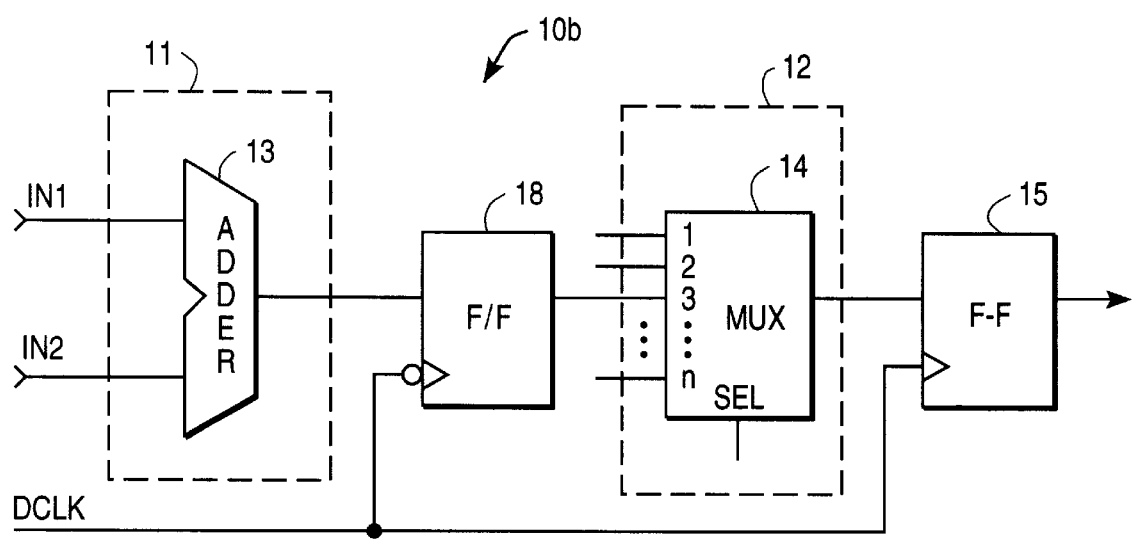
FIG. 4 is an alternative scheme to the circuit diagram shown in FIG. 3, in which a flip-flop is inserted between the serially arranged combinational logic circuits to control the timing of noise generation by the digital stage.

A variety of circuit components can be adapted to provide this function. FIGS. 3 and 4 illustrate two preferred techniques. In FIG. 3, a latch 17 is shown inserted between the combinational circuit 11 and the combinational circuit 12 of digital circuit stage 10a. In the specific example, latch 17 is inserted between the adder 13 and MUX 14. The latch is a level sensitive device and the particular latch 17 is triggered to be transparent when DCLK is low.

In the circuit of FIG. 3, the adder 13 commences to process the digital inputs IN1 and IN2 at the rising edge of DCLK, which occurs after the first analog sampling event. The adder processes the inputs during the half-cycle when DCLK is high. During this first half-cycle, the latch 17 is turned off. Since the output of the latch 17 has not changed (that is, the adder output is coupled to the latch 17 input, but not latched through to the latch 17 output), MUX 14 does not commence to change it's state. Thus, the noise generation component 41 during the first half-cycle of the DCLK signal is due to the operation of the adder 13 circuitry. Then, as the adder 13 begins to complete its operations, the noise level also diminishes and, when properly designed, the noise will be minimized by the time the second analog sampling event is to occur.

Subsequently, at the falling edge of the DCLK signal, latch 17 activates and MUX 14 commences to process the signal states latched from the latch 17. Noise component 42 exemplifies the operation of the MUX 14. Thus, the noise component 42 occurs during the second half-cycle of the DCLK signal and abates prior to the occurrence of the next sampling event at the falling edge of ACLK1. Accordingly, the latch 17 inserts a quiet (reduced or abated noise) period at the occurrence of the second analog sampling event (at the rising edge of ACLK1) by separating the operation of the circuitry in the stage 10a, which separation is controlled by the state of the digital clocking signal.

Thus, in the example, data propagates through the adder 13 during the high phase of DCLK, but the output of the latch 17 does not change until after the falling edge of DCLK. After the falling edge of DCLK, the latch 17 becomes transparent and the output of the adder 13 propagates through the MUX 14 and is latched into the FF 15 on the next rising edge of DCLK. The latch 17 functions as a pipeline stage and holds the input to the MUX 14 constant during the high phase of DCLK. This technique allows the complete path (of stage 10a) to operate within one clock cycle of DCLK and also allows the digital activity to be minimized when the second analog sampling event is occurring.

An alternative technique is shown in FIG. 4. In FIG. 4, the circuitry of FIG. 3 is duplicated, but a flip-flop (FF) 18 is used instead of the latch 17. The stage is denoted as stage 10b. The FF 18 is responsive to the falling edge of the DCLK signal to pass its input to the MUX 14. Accordingly, either the latch 17 of FIG. 3 or the FF 18 of FIG. 4 can be utilized to separate the digital stage into two noise generating events, wherein the noise generation is significantly reduced (or abated) during the periods of analog sampling.

Of the latch 17 or FF 18, the more preferred use is with the latch 17. Since flip-flops are strictly edge triggered devices (not level triggered like the latch), the adder 13 must complete its processing and generate its output prior to the falling edge of DCLK. This requirement can place some constraints on the adder circuitry. However, this constraint is not present with a latch. Latches are level sensitive devices, so that the latch 17 maintains its signal transparency (passing its input to the output) while DCLK remains low. If the adder 13 had not concluded its processing prior to the end of the first half-cycle of DCLK, the adder output would continue to be passed to the MUX after the commencement of the second half-cycle of DCLK. Since there will be some noise generation associated with the completion of the adder processing, some amount of this noise will be present during the second sampling event, resulting in some degraded performance for the ADC. However, the noise associated with the MUX 14 will still not occur until after the commencement of the second half-cycle of DCLK.

Thus, during the normal operating conditions, the adder 13 completes its operation during the first phase of the DCLK and the second phase of DCLK is used to multiplex and latch the data into the FF 15. If the time needed for the muxing and latching of the data into the FF 15 is less than the time available before the recurrence of the first sampling event of the next analog cycle, then that extra time can be borrowed by the adder 13. The adder 13 output states are still coupled to the MUX 14, since the latch 17 is a level triggered device. The adder operation into the second half-cycle of DCLK allows adder output to be coupled to the MUX 14, but with some degraded performance since digital noise generation is not minimized. However, in practice, few data combinations exercise the critical path to its fullest and, hence, for most of the computations performed, there will not be digital activity when the second analog sampling event occurs. Accordingly, the use of the latch 17 over the FF 18 allows for operation of the adder circuitry with some degraded analog performance, if faster adders cannot be readily implemented or if changes in the environment causes the circuit operational speed to slow down. Additionally, the latch enables the performance of a given circuit to gently degrade at higher speeds.

It is appreciated that the ADC 20 of the present invention can be utilized in a variety of ways and implemented in a variety of systems. For example, in FIG. 5 a signal processing system 50 is shown, which utilizes the ADC 20. A sensor unit 51 monitors a given environment and generates an analog signal in response to its sensing activity in receiving a stimulus. For example, the sensor unit 51 can be a hydrophone used for passive sonar applications. The sensor transmits analog information to the ADC 20. A preamplifier 52 is utilized in the particular example to boost the signal to the ADC 20.

Figure 5:
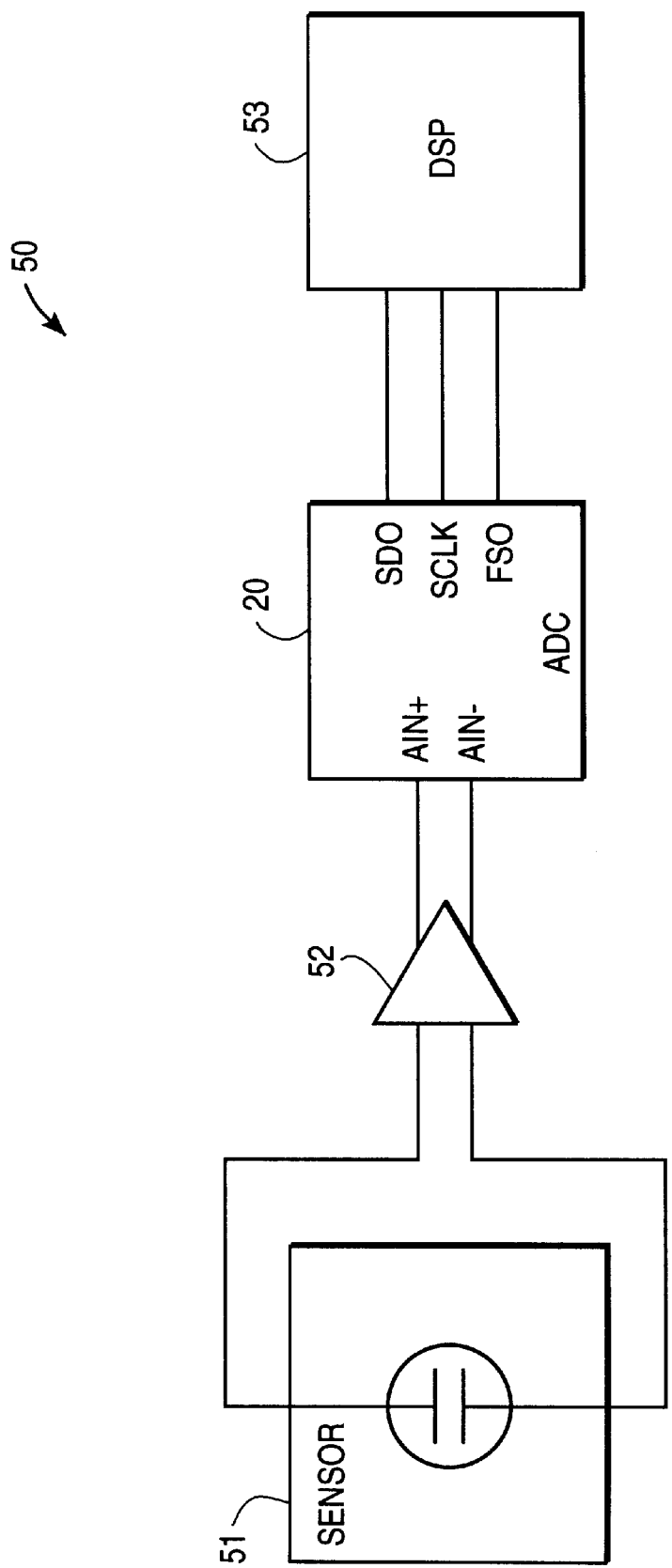
FIG. 5 shows one example of a system in which the analog-to-digital converter of the present invention is used to convert an analog signal from a sensor into a digital word for processing by a digital signal processor.

The analog signal is coupled as input to the ADC 20 at AIN+ and AIN− terminals. The SDO, SCLK and FSO outputs of the ADC 20 are then coupled to a digital signal processing unit 53 for processing the digital signal from the ADC 20. The DSP 53 can be of a variety of digital processing devices. The DSP 53 manipulates the digital information from the ADC 20, which digital information is the digital representation of the analog signal sent by the sensor 51. FIG. 5 is but just one example of how the ADC 20 implementing the present invention can be utilized.

The present invention manages noise generation so that noise from digital circuitry is abated or reduced significantly during analog sampling events, when digital and analog circuits are operating at or proximal to the same frequency and the analog sampling is performed more than once during a cycle (such as at both the rising and falling edges of the analog clock). The invention implements the noise management by separating the activation of the digital circuitry of a given stage into two separate periods so that a quiet period exists when the analog inputs are sampled. A variety of devices and circuits can be implemented to provide for the invention. The preferred technique employs a latch or a flip-flop between two combinational logic circuits of a digital stage to time the activation period of the latter circuit until after the analog sampling event.

We claim:

1. An apparatus for separating an operation of a digital stage into separate activation periods for timing of noise generation comprising:

a first digital circuit forming a front end of the digital stage;

a second digital circuit coupled subsequent to said first digital circuit in the digital stage and in which a digital signal is coupled through the digital stage in a clock cycle of a digital clocking signal, the digital stage commencing to process the digital signal during a first period of the clock cycle;

a timing circuit coupled to said first and second digital circuits for preventing the activation of the second digital circuit until a later period of the clock cycle, but not until after an occurrence of an analog sampling event.

2. The apparatus of claim 1 wherein analog sampling is obtained at both rising and falling edges of an analog clocking signal which frequency is at or proximate to the digital clocking frequency.

3. The apparatus of claim 1 wherein said timing circuit is comprised of a flip-flop coupled between said first and second digital circuits and in which the flip-flop is triggered at the later period of the clock cycle to activate said second circuit.

4. The apparatus of claim 1 wherein said timing circuit is comprised of a latch coupled between said first and second digital circuits and in which the latch is triggered at the later period of the clock cycle to activate said second circuit.

5. The apparatus of claim 4 wherein said latch is level triggered so that an output from said first digital circuit is continuously coupled through to said second circuit during the later period of the clock cycle.

6. In a mixed-signal integrated circuit having analog and digital signals in which an analog clocking signal occurs at a frequency at or proximal to a digital clocking signal, an apparatus for separating an operation of a digital stage into separate activation periods for noise reduction comprising:

a first digital circuit forming a front end of the digital stage;

a second digital circuit coupled subsequent to said first digital circuit in the digital stage and in which a digital signal is coupled through the digital stage in the clock cycle of a digital clocking signal, the digital stage commencing to process the digital signal during a first period of the clock cycle;

a timing circuit coupled to said first and second digital circuits for preventing the activation of the second digital circuit until a second period of the clock cycle, but not until after an occurrence of an analog sampling event.

7. The apparatus of claim 6 wherein said timing circuit is comprised of a flip-flop coupled between said first and second digital circuits and in which the flip-flop is triggered at the second period of the clock cycle to activate said second circuit.

8. The apparatus of claim 6 wherein said timing circuit is comprised of a latch coupled between said first and second digital circuits and in which the latch is triggered at the second period of the clock cycle to activate said second circuit.

9. The apparatus of claim 8 wherein said latch is level triggered so that an output from said first digital circuit is continuously coupled through to said second circuit during the second period of the clock cycle.

10. In an analog-to-digital converter for converting analog signals into digital words in which at least two analog samples are obtained during one clock cycle of the digital clocking signal, an apparatus for separating an operation of a digital stage into separate activation periods comprising:

a first digital circuit forming a front end of the digital circuit stage;

a second digital circuit coupled subsequent to said first digital circuit in the digital stage and in which a digital signal is coupled through the digital stage in the clock cycle of the digital clocking signal, the digital stage commencing to process the digital signal during a first period of the clock cycle;

a timing circuit coupled to said first and second digital circuits for preventing the activation of the second digital circuit until a second period of the clock cycle, but not until after an occurrence of an analog sampling event.

11. The apparatus of claim 10 wherein said timing circuit is comprised of a flip-flop coupled between said first and second digital circuits and in which the flip-flop is triggered at the commencement of the second period of the clock cycle to activate said second circuit.

12. The apparatus of claim 10 wherein said timing circuit is comprised of a latch coupled between said first and second digital circuits and in which the latch is triggered at the second period of the clock cycle to activate said second circuit.

13. The apparatus of claim 12 wherein said latch is level triggered so that an output from said first digital circuit is continuously coupled through to said second circuit during the second period of the clock cycle.

14. A method of separating an operation of a digital stage into separate activation periods for separation of noise generation comprising:

receiving a digital signal as an input to the digital stage;

timing the operation of the digital stage to process the digital signal by activating portions of the digital stage at different periods of a digital clock cycle to abate noise generation during an occurrence of an analog sampling event.

15. The method of claim 14 further including the performing of a first analog sampling event prior to a commencement of the digital clock cycle and performing a second analog sampling event while noise generation is abated.

16. The method of claim 15 further including the latching of an output from a first portion of the digital stage during one period of the digital clock to control the timing when the output is coupled to activate a second portion of the digital stage during a later period of the digital clock, the analog sampling event occurring prior to the activating of the second portion of the digital stage.

17. The method of claim 15 further including the latching of an output from a first portion of the digital stage during first period of the digital clock to control the timing when the output is coupled to activate a second portion of the digital stage at the end of the first period of the digital clock, the analog sampling event occurring prior to the activating of the second portion of the digital stage.

18. In an analog-to-digital converter, a method of separating an operation of a digital stage into separate activation periods for separation of noise generation during analog sampling comprising:

receiving a digital signal as an input to the digital stage;

timing the operation of the digital stage to process the digital signal by activating portions of the digital stage at different periods of a digital clock cycle to abate noise generation during an occurrence of an analog sampling event.

19. The method of claim 18 further including the performing of a first analog sampling event prior to a commencement of the digital clock cycle and performing a second analog sampling event while noise generation is abated.

20. The method of claim 19 further including the latching of an output from a first portion of the digital stage during one period of the digital clock to control the timing when the output is coupled to activate a second portion of the digital stage during a later period of the digital clock, the analog sampling event occurring prior to the activating of the second portion of the digital stage.

21. The method of claim 20 further including the latching of an output from a first portion of the digital stage during first period of the digital clock to control the timing when the output is coupled to activate a second portion of the digital stage at the end of the first period of the digital clock, the analog sampling event occurring prior to the activating of the second portion of the digital stage.

22. An apparatus for receiving a stimulus, generating an analog signal and converting the analog signal to a digital signal for processing comprising:

a sensor for generating the analog signal in response to the stimulus;

an analog-to-digital converter coupled to said sensor for sampling the analog signal as an input and converting the analog input to the digital signal, said converter including at least one digital stage for processing the digital signal, the digital stage including (a) a first digital circuit forming a front end of the digital stage;

(b) a second digital circuit coupled subsequent to said first digital circuit in the digital stage and in which a digital signal is coupled through the digital stage in a clock cycle of a digital clocking signal, the digital stage commencing to process the digital signal during a first period of the clock cycle;

(c) a timing circuit coupled to said first and second digital circuits for preventing the activation of the second digital circuit until a later period of the clock cycle, but not until after an occurrence of an analog sampling event.

23. The apparatus of claim 22 wherein analog sampling is obtained at both rising and falling edges of an analog clocking signal which frequency is at or proximate to the digital clocking frequency.

24. The apparatus of claim 22 wherein said timing circuit is comprised of a flip-flop coupled between said first and second digital circuits and in which the flip-flop is triggered at the later period of the clock cycle to activate said second circuit.

25. The apparatus of claim 22 wherein said timing circuit is comprised of a latch coupled between said first and second digital circuits and in which the latch is triggered at the later period of the clock cycle to activate said second circuit.

26. The apparatus of claim 22 wherein said latch is level triggered so that an output from said first digital circuit is continuously coupled through to said second circuit during the later period of the clock cycle.

* * * * *